(12) United States Patent
Tian et al.

(10) Patent No.: US 10,571,737 B2
(45) Date of Patent: Feb. 25, 2020

(54) QUANTUM DOT DISPLAY SUBSTRATE AND MANUFACTURING METHOD THEREOF, AND QUANTUM DOT DISPLAY DEVICE

(71) Applicant: BOE TECHNOLOGY GROUP CO., LTD., Beijing (CN)

(72) Inventors: Yunyun Tian, Beijing (CN); Jing Lv, Beijing (CN); Yunsik Im, Beijing (CN); Hyunsic Choi, Beijing (CN); Zezhou Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 283 days.

(21) Appl. No.: 15/572,327

(22) PCT Filed: May 2, 2017

(86) PCT No.: PCT/CN2017/082684
§ 371 (c)(1),
(2) Date: Nov. 7, 2017

(87) PCT Pub. No.: WO2018/006639
PCT Pub. Date: Jan. 11, 2018

(65) Prior Publication Data
US 2018/0233686 A1    Aug. 16, 2018

(30) Foreign Application Priority Data
Jul. 8, 2016    (CN) .......................... 2016 1 0538470

(51) Int. Cl.
*G02F 1/1335* (2006.01)
*H01L 51/50* (2006.01)

(52) U.S. Cl.
CPC .. *G02F 1/133526* (2013.01); *G02F 1/133512* (2013.01); *G02F 1/133514* (2013.01); *G02F 1/133524* (2013.01); *H01L 51/502* (2013.01)

(58) Field of Classification Search
None
See application file for complete search history.

(56) References Cited

U.S. PATENT DOCUMENTS

| 5,990,993 A | 11/1999 | Haas |
|---|---|---|
| 2008/0084517 A1 | 4/2008 | Itou et al. |

(Continued)

FOREIGN PATENT DOCUMENTS

| CN | 102768433 A | 11/2012 |
|---|---|---|
| CN | 103235442 A | 8/2013 |

(Continued)

OTHER PUBLICATIONS

First Office Action dated Oct. 10, 2017 in corresponding Chinese Patent Application No. 201610538470.2.

(Continued)

*Primary Examiner* — Phu Vu
(74) *Attorney, Agent, or Firm* — Nath, Goldberg & Meyer; Joshua B. Goldberg; Daniel J. Bissing (57) ABSTRACT

The present disclosure discloses a quantum dot display substrate and a manufacturing method thereof, and a quantum dot display device. The quantum dot display substrate comprises black matrix patterns, quantum dot patterns surrounded by the quantum dot patterns, a first base substrate, and a first optical layer and a second optical layer both arranged on a side of the first base substrate, and the first optical layer is arranged on a side of the second optical layer away from the first base substrate; the first optical layer is configured to collimate incident light to generate collimated light and transmit the collimated light to the second optical layer; the second optical layer is configured to adjust an outgoing direction of the collimated light to generate outgoing light, and make the outgoing light irradiate onto the black matrix patterns.

20 Claims, 6 Drawing Sheets

(56) References Cited

U.S. PATENT DOCUMENTS

| | | | |
|---|---|---|---|
| 2010/0182686 A1* | 7/2010 | Fukushima | G02B 27/2214 |
| | | | 359/463 |
| 2015/0309359 A1 | 10/2015 | Wu et al. | |
| 2017/0255042 A1 | 9/2017 | Cheng | |
| 2017/0255055 A1 | 9/2017 | Liang | |

FOREIGN PATENT DOCUMENTS

| | | | |
|---|---|---|---|
| CN | 104280931 A | 1/2015 |
| CN | 105223724 A | 1/2016 |
| CN | 105388668 A | 3/2016 |
| CN | 105589251 A | 5/2016 |
| CN | 105929591 A | 9/2016 |
| CN | 205787484 U | 12/2016 |

OTHER PUBLICATIONS

International Search Report dated Jul. 26, 2017 in corresponding International Application No. PCT/CN2017/082684 along with an English translation of the International Search Report and an English translation of the Written Opinion of the International Searching Authority.

\* cited by examiner

QUANTUM DOT DISPLAY SUBSTRATE AND MANUFACTURING METHOD THEREOF, AND QUANTUM DOT DISPLAY DEVICE

This is a National Phase Application filed under 35 U.S.C. 371 as a national stage of PCT/CN2017/082684, filed May 2, 2017, an application claiming the benefit of Chinese Application No. 201610538470.2, filed Jul. 8, 2016, the content of each of which is hereby incorporated by reference in its entirety.

TECHNICAL FIELD

The present disclosure relates to the field of display technology, in particular to a quantum dot display substrate and a manufacturing method thereof, and a quantum dot display device.

BACKGROUND

With the development of liquid crystal display technology, a quantum dot (QD) display device is used more and more widely. The quantum dot display device can comprise red quantum dot patterns and green quantum dot patterns.

SUMMARY

The present disclosure provides a quantum dot display substrate and a manufacturing method thereof, and a quantum dot display device such that the quantum dot display device can display in a real dark state.

The present disclosure provides a quantum dot display substrate, comprising black matrix patterns, quantum dot patterns surrounded by the black matrix patterns, a first base substrate, and a first optical layer and a second optical layer both arranged on a side of the first base substrate, and the first optical layer is arranged on a side of the second optical layer away from the first base substrate;

the first optical layer is configured to collimate incident light to generate collimated light and transmit the collimated light to the second optical layer; and the second optical layer is configured to adjust an outgoing direction of the collimated light to generate outgoing light, and make the outgoing light irradiate onto the black matrix patterns and prevent the outgoing light from irradiating onto the quantum dot patterns.

Optionally, the quantum dot patterns and the black matrix patterns are arranged on a side of the second optical layer away from the first optical layer.

Optionally, the black matrix patterns are arranged on a side of the quantum dot patterns away from the second optical layer.

Optionally, the quantum dot display substrate further comprises a protective layer arranged on the black matrix patterns and a first polarizer arranged on the protective layer; wherein the quantum dot patterns are arranged on the first polarizer.

Optionally, the incident light is ambient light.

Optionally, the first optical layer comprises a plurality of convex lens structures.

Optionally, convex surfaces of the plurality of convex lens structures are configured to face towards the second optical layer.

Optionally, the first optical layer further comprises a first base layer, and the plurality of convex lens structures are arranged in the first base layer.

Optionally, the plurality of convex lens structures are uniformly distributed.

Optionally, the second optical layer comprises a plurality of optical waveguide structures, configured to make the collimated light undergo total reflection to generate the outgoing light and make the outgoing light irradiate onto the black matrix patterns.

Optionally, the second optical layer comprises a second base layer, configured to cover the plurality of optical waveguide structures.

Optionally, the plurality of optical waveguide structures are arc-shaped.

Optionally, a cambered surface of a longitudinal section of the optical waveguide structure is recessed inside of the optical waveguide structure.

Optionally, each point on the cambered surface of the optical waveguide structure has a predetermined radian such that the collimated light undergoes a total reflection at the point to generate the outgoing light which will irradiate onto the black matrix pattern.

Optionally, the quantum dot patterns are arranged on a side of the optical waveguide structures away from the first optical layer, and the optical waveguide structures and the quantum dot patterns are arranged in one-to-one correspondence manner.

Optionally, the quantum dot patterns and the first optical layer are arranged at a same side of the first base substrate, and the optical waveguide structures are arranged on the quantum dot patterns, respectively.

Optionally, the quantum dot pattern is selected from a red quantum dot pattern, a green quantum dot pattern, or a combination thereof.

The present disclosure provides a quantum dot display device, comprising: an array substrate and the above quantum dot display substrate, which are arranged opposite to each other.

The present disclosure provides a manufacturing method of the above quantum dot display substrate, comprising:

forming black matrix patterns and quantum dot patterns on the first base substrate such that the quantum dot patterns are arranged between the black matrix patterns, respectively;

forming the second optical layer on a side of the first base substrate; and forming a first optical layer on a side of the second optical layer away from the first base substrate such that the first optical layer is configured to collimate incident light to generate collimated light and transmit the collimated light to the second optical layer; and the second optical layer is configured to adjust an outgoing direction of the collimated light to generate an outgoing light, and make the outgoing light irradiate onto the black matrix patterns and prevent the outgoing light from irradiating onto the quantum dot patterns.

Optionally, the second optical layer comprises a second base layer and a plurality of optical waveguide structures;

the step of forming the second optical layer on a side of the first base substrate further comprises:

forming the plurality of optical waveguide structures on a side of the first base substrate; and forming the second base layer on the plurality of optical waveguide structures.

Optionally, the first optical layer comprises a first base layer and a plurality of convex lens structures;

the step of forming a first optical layer on a side of the second optical layer away from the first base substrate comprises:

forming the first base layer on a side of the second optical layer away from the first base substrate; and forming the plurality of convex lens structures in the first base layer.

DETAILED DESCRIPTION

In order to make a person skilled in the art better understand the technical solution of the present disclosure, the quantum dot display substrate and the manufacturing method thereof, and the quantum point display device provided by the present disclosure will be described in detail below in combination with the drawings.

Figure 1:
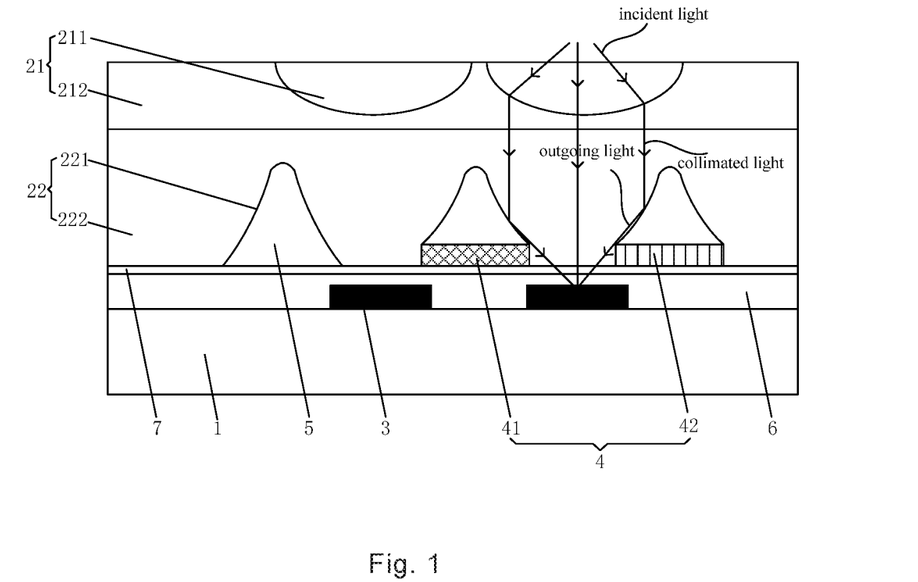
FIG. 1 is a schematic diagram of a quantum dot display substrate provided by a first embodiment of the present disclosure.

FIG. 1 is a schematic diagram of a quantum dot display substrate provided by a first embodiment of the present disclosure. As shown in FIG. 1, the quantum dot display substrate comprises black matrix patterns 3 and quantum dot patterns 4 surrounded by the black matrix patterns 3, the quantum dot display substrate further comprises: a first base substrate 1, and a first optical layer 21 and a second optical layer 22 arranged on a side of the first base substrate 1, and the first optical layer 21 is arranged on a side of the second optical layer 22 away from the first base substrate 1. The first optical layer 21 is configured to collimate incident light to generate collimated light and transmit the collimated light to the second optical layer 22. The second optical layer 22 is configured to adjust outgoing direction of the collimated light to generate outgoing light, and make the outgoing light irradiate onto the black matrix patterns 3.

In the embodiment, the incident light may be ambient light.

In the embodiment, collimated light may be parallel light.

In the embodiment, the first optical layer 21 comprises a plurality of convex lens structures 211. A convex surface of the convex lens structure 211 faces towards the second optical layer 22. Furthermore, the first optical layer 21 further comprises a first base layer 212, and the plurality of convex lens structures 211 are arranged in the first base layer 212. The convex lens structure 211 can collimate the incident light to generate collimated light, and make the collimated light pass through the first base layer 212 and enter into the second optical layer 22. Optionally, the plurality of convex lens structures 211 are uniformly distributed. Only two convex lens structures 211 are described in the figures. Optically, a refractive index of the convex lens structure 211 is greater than that of the first base layer 212. Optionally, a material of the convex lens structure 211 comprises, but is not limited to, resin, and a material of the first base layer 212 comprises, but is not limited to, silicon oxide or silicon oxynitride, wherein the silicon oxide can be silicon dioxide.

Figure 2:
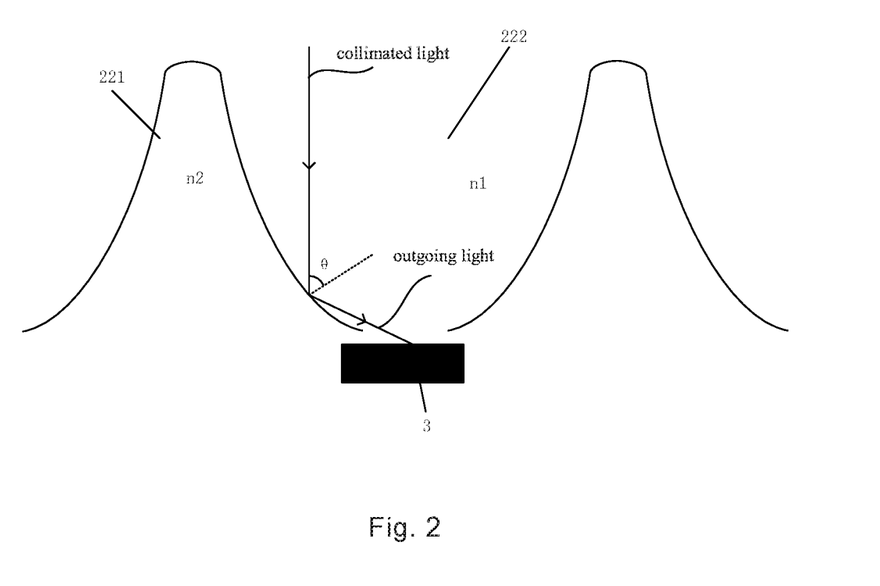
FIG. 2 is a schematic diagram illustrating an optical path in a second optical layer in FIG. 1.

In the embodiment, the second optical layer 22 comprises a plurality of optical waveguide structures 221. The optical waveguide structures 221 are configured to make the collimated light undergo total reflection to generate outgoing light, and make the outgoing light irradiate onto the black matrix patterns 3. Optionally, the optical waveguide structure 221 is arc-shaped. As shown in FIGS. 1 and 2, optionally, a cambered surface of a longitudinal section of the optical waveguide structure 221 bends towards inside of the optical waveguide structure 221, that is to say, the cambered surface of the longitudinal section of the optical waveguide structure 221 is recessed into the optical waveguide structure 221. Furthermore, the second optical layer 22 also comprises a second base layer 222 configured to cover the optical waveguide structures 221. Optionally, the second base layer 221 is a flat layer. Optionally, a material of the optical waveguide structure 221 comprises, but is not limited to, resin, and a material of the second base layer 222 comprises, but is not limited to, silicon oxide or silicon oxynitride, wherein the silicon oxide may be silicon dioxide.

Each point on the cambered surface of the optical waveguide structure 221 has a predetermined radian such that the collimated light undergoes a total reflection at the point to generate the outgoing light which will irradiate onto the black matrix pattern 3, for example, the collimated light undergoes a total reflection at the point to generate the outgoing light which will irradiate onto a central position of the black matrix pattern 3. In summary, the predetermined radian at each point on the cambered surface of the optical waveguide structure 221 is configured to make the outgoing light after undergoing a total reflection irradiate onto the black matrix pattern 3.

FIG. 2 is a schematic diagram illustrating an optical path in the second optical layer in FIG. 1. As shown in FIG. 2, when the collimated light irradiates on the cambered surface of the optical waveguide structure 221, the collimated light undergoes a total reflection on the cambered surface of the optical waveguide structure 221 to generate the outgoing light, and the outgoing light irradiates onto the black matrix pattern 3. When the total reflection occurs $n1 \sin\theta = n2 \sin 90°$, then $n1 \sin\theta = n2$, where $n1$ is a refractive index of the second base layer 222, $n2$ is a refractive index of the optical waveguide structure 221, and $\theta$ is a critical incident angle of the collimated light. In the embodiment, materials of the optical waveguide structure 221 and the second base layer 222 may be selected such that $\theta \geq 45°$.

In the embodiment, the quantum dot patterns 4 and the first optical layer 21 are arranged at a same side of the first base substrate 1, and the black matrix patterns 3 and the first optical layer 21 are arranged at a same side of the first base substrate 1. The quantum dot pattern 4 may be a red quantum dot pattern 42 or a green quantum dot pattern 41. Further, a non quantum dot pixel region 5 may be defined by the black matrix patterns 3, and as shown in FIG. 1, there is no pixel pattern arranged at the non quantum dot pixel region 5; or a blue pixel pattern may be arranged at the non quantum dot pixel region 5, and the blue pixel pattern may be a blue resin pattern, but not a blue quantum dot pattern. The quantum dot patterns 4 are arranged on a side of the optical waveguide structures 221 away from the first optical layer 21, and the optical waveguide structures 221 and the quantum dot patterns 4 are arranged in one-to-one correspondence manner. Specifically, the black matrix patterns 3 are arranged on the first base substrate 1; a protective layer 6 is arranged on the black matrix patterns 3 to cover the black matrix patterns 3, optionally, the protective layer 6 is a flat layer. The quantum dot display substrate further comprises a first polarizer 7, arranged above the black matrix patterns 3, specifically, the first polarizer 7 is arranged on the protective layer 6; the quantum dot patterns 4 are arranged on the first polarizer 7; the optical waveguide structures 221 are arranged on the quantum dot patterns 4; and the first base layer 212 is arranged on the second base layer 222.

Further, the non quantum dot pixel region 5 is provided with an optical waveguide structure 221 therein, and if there is no pixel pattern arranged at the non quantum dot pixel region 5, the optical waveguide structure provided in the non quantum dot pixel region 5 is arranged on the first polarizer 7.

As shown in FIG. 1, the incident light is incident from one side of the first optical layer 21 away from the second optical layer 22, and the outgoing light is emitted from a side of the second optical layer 22 away from the first optical layer 21.

As shown in FIG. 1, there is a gap between every two adjacent quantum dot patterns 4, and these gaps correspond to the black matrix patterns 3, respectively. The outgoing light reflected by the optical waveguide structure 221 will pass through the gap and irradiate onto the black matrix pattern 3.

In the embodiment, when the quantum dot display substrate and an opposite substrate are arranged opposite to each other to form a display device, the side of the first base substrate 1, on which the first optical layer 21 and the second optical layer 22 are arranged, refers to the side of the first base substrate 1 away from the substrate opposite. Optionally, the quantum dot display substrate may be a color filter substrate, and the opposite substrate may be an array substrate.

Optionally, in a practical application, the quantum dot patterns and the first optical layer are arranged at different sides of the first base substrate, which case is not particularly drawn, and in this case, both the quantum dot patterns and the black matrix patterns are arranged on a side of the first base substrate away from the first and second optical layers; optionally, the black matrix patterns and the first optical layer are arranged at different sides of the first base substrate, which case is not particularly drawn, and in this case, the black matrix patterns are arranged on a side of the first base substrate away from the first optical layer provided with the quantum dot patterns therein and the second optical layer.

In the embodiment, the position relationships among the structures in the quantum dot display substrate comprise, but are not limited to, the above position relationships. In a practical application, the positions of the structures in the quantum dot display substrate may be changed according to the requirements, which will not be enumerated herein.

In the solution of the quantum dot display substrate of the embodiment, the first optical layer is configured to collimate incident light to generate collimated light and transmit the collimated light to the second optical layer; the second optical layer is configured to adjust an outgoing direction of the collimated light to generate an outgoing light, and make the outgoing light irradiate onto the black matrix patterns, which prevents the outgoing light from irradiating onto the quantum dot pattern and makes the quantum dot display panel display in a real dark state. The quantum dot display substrate of the embodiment achieves true color, wide gamut, and high transmittance.

Figure 3:
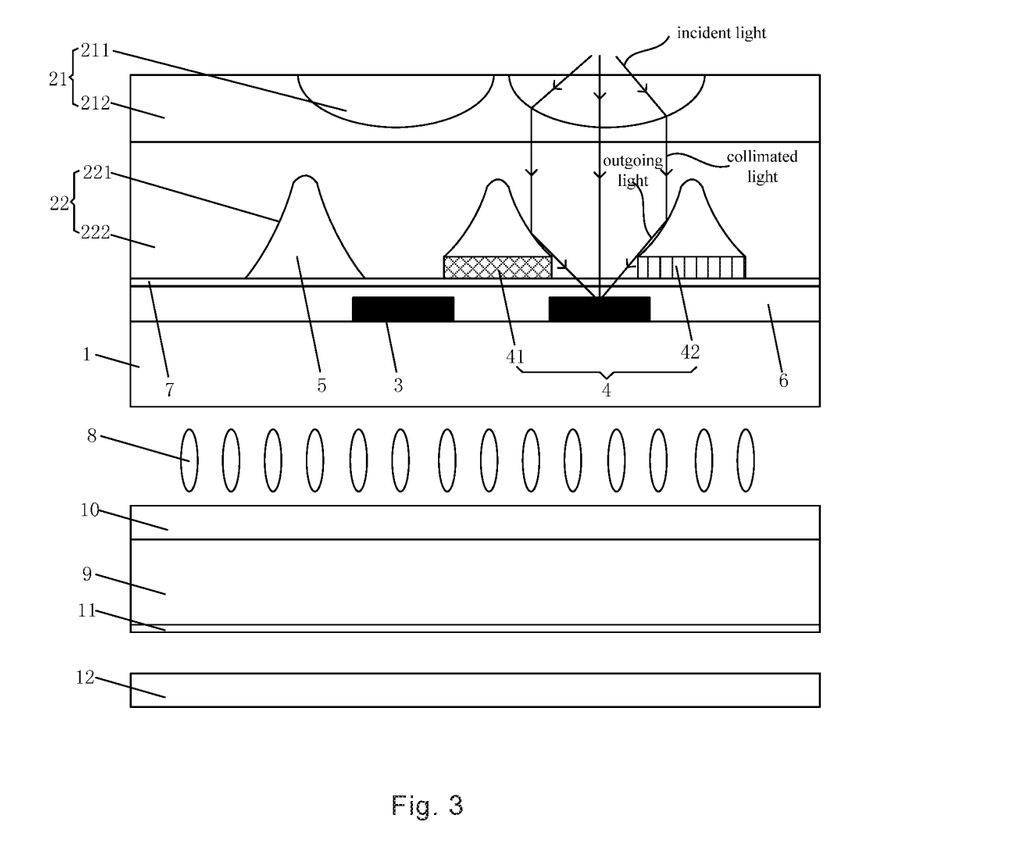
FIG. 3 is a schematic diagram of a quantum dot display device provided by a second embodiment of the present disclosure.

FIG. 3 is a schematic diagram of a quantum dot display device of a second embodiment of the present disclosure. As shown in FIG. 3, the quantum dot display device comprises an array substrate and a quantum dot display substrate arranged opposite to each other.

In the embodiment, optionally, the quantum dot display substrate is a color filter substrate, and a liquid crystal layer 8 is arranged between the quantum dot display substrate and the array substrate. The array substrate may comprise a second base substrate 9 and an array structure 10 arranged on a side of the second base substrate 9 close to the quantum dot display substrate, and a second polarizer 11 is arranged on a side of the second base substrate 9 away from the quantum dot display device. The array structure 10 includes gate lines and data lines which define pixel units, and the pixel unit comprises a thin film transistor and a pixel electrode. The particular structure of the array substrate 10 is not drawn. Further, the quantum dot display substrate further comprises the second polarizer 11 arranged on a side of the second base substrate 9 away from the quantum dot display substrate.

Furthermore, the quantum dot display device also comprises a backlight 12, and the backlight 12 is located on a side of the second base substrate 9 away from the quantum dot display substrate. The backlight 12 is blue light source, for example, a blue light LED. When the blue light emitted from the backlight 12 passes through the red quantum dot pattern 42, red light will be emitted from the red quantum dot pattern 42; when the blue light emitted from the backlight 12 passes through the green quantum dot pattern 41, green light will be emitted from the green quantum dot pattern 41; and when the blue light emitted from the backlight 12 directly passes through the non quantum dot pixel region 5, blue light will be emitted from the non quantum dot pixel region 5.

In the embodiment, the quantum dot display substrate may be the quantum dot display substrate provided by the first embodiment, which is not described in detail any more.

In the solution of the quantum dot display device of the embodiment, the first optical layer is configured to collimate incident light to generate collimated light and transmit the collimated light to the second optical layer; the second optical layer is configured to adjust an outgoing direction of the collimated light to generate outgoing light, and make the outgoing light irradiate onto the black matrix patterns, which prevents the outgoing light from irradiating onto the quantum dot pattern and makes the quantum dot display panel display in a real dark state. The quantum dot display substrate of the embodiment achieves true color, wide gamut, and high transmittance.

A manufacturing method of a quantum dot display is provided by a third embodiment of the present disclosure and comprises:

Step 101, forming black matrix patterns and quantum dot patterns on a first base substrate such that the quantum dot patterns are arranged between the black matrix patterns, respectively;

Step 102, forming a second optical layer on a side of the first base substrate.

Specifically, the second optical layer comprises a second base layer and a plurality of optical waveguide structures, and the step 102 may comprise: forming the plurality of optical waveguide structures at the side of the first base substrate, and forming the second base layer on the optical waveguide structures.

Step 103, forming a first optical layer on a side of the second optical layer away from the first base substrate such that the first optical layer is configured to collimate incident light to generate collimated light and transmit the collimated light to the second optical layer; and the second optical layer is configured to adjust an outgoing direction of the collimated light to generate outgoing light, and make the outgoing light irradiate onto the black matrix patterns.

In particular, the first optical layer comprises a first base layer and a plurality of convex lens structures, and the step 103 may comprise: forming the first base layer on the second base layer; and forming the plurality of convex lens structures in the first base layer.

Figure 4:
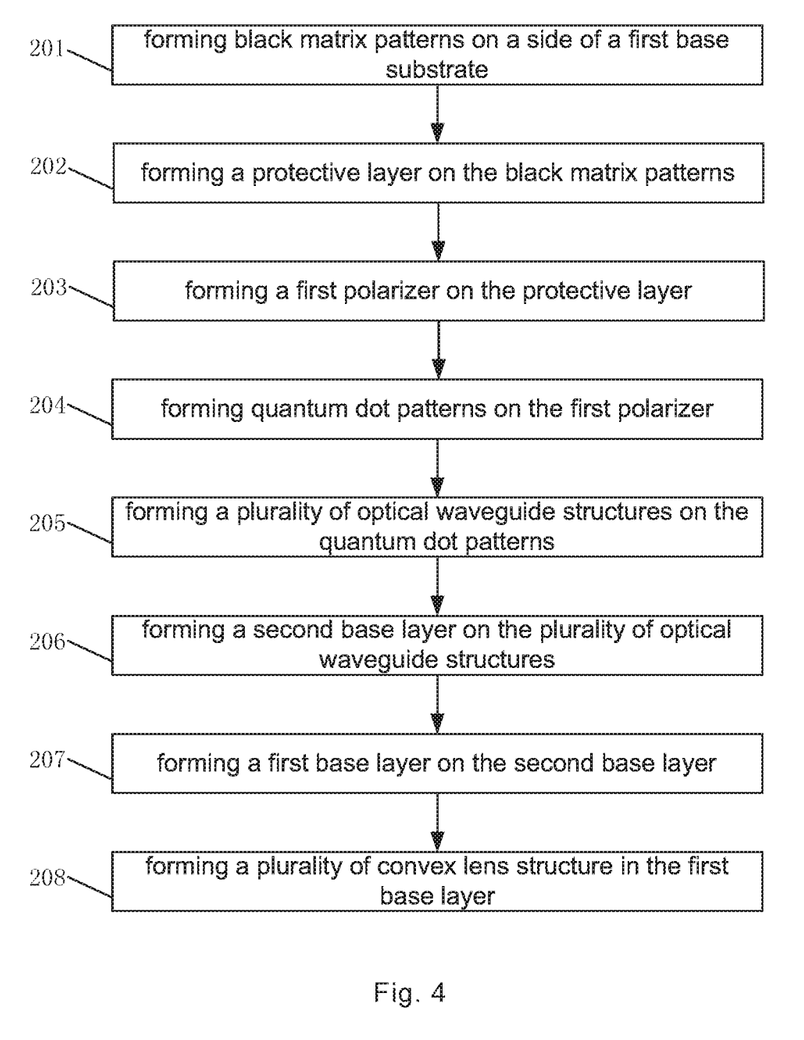
FIG. 4 is a flow chart illustrating a manufacturing method of a quantum dot display substrate provided by a third embodiment of the present disclosure.

A specific example is given to describe the manufacturing method of the quantum dot display substrate provided by the third embodiment of the present disclosure. FIG. 4 is a flow chart illustrating a manufacturing method of a quantum dot display substrate provided by the third embodiment of the present disclosure, as shown in FIG. 4:

Step 201, forming black matrix patterns on a side of a first base substrate.

Figure 5A:
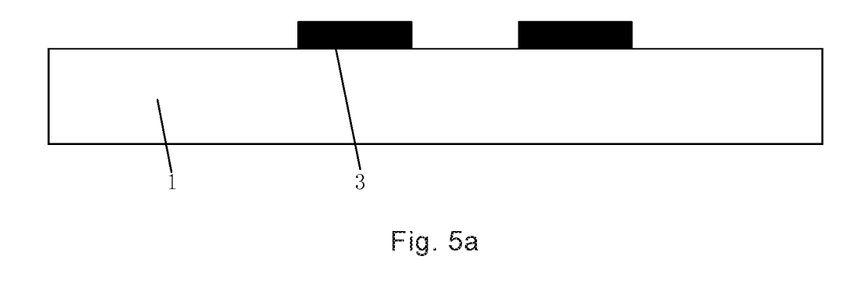
FIG. 5a is a schematic diagram illustrating forming black matrix patterns in the third embodiment.

FIG. 5a is a schematic diagram illustrating forming black matrix patterns in the third embodiment, and as shown in FIG. 5a, black matrix patterns 3 are formed on the side of the first base substrate 1 by a patterning process.

Step 202, forming a protective layer on the black matrix patterns.

Figure 5B:
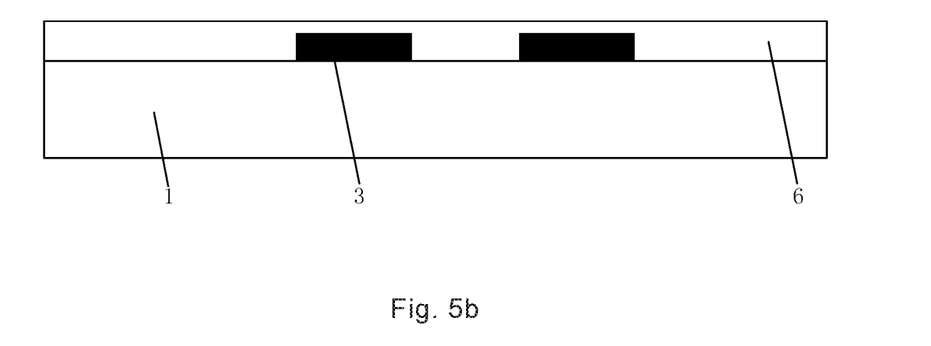
FIG. 5b is a schematic diagram illustrating forming a protective layer in the third embodiment.

FIG. 5b is a schematic diagram illustrating forming a protective layer in the third embodiment, and as shown in FIG. 5b, a protective layer 3 is deposited on the black matrix patterns 3.

Step 203, forming a first polarizer on the protective layer.

Figure 5C:
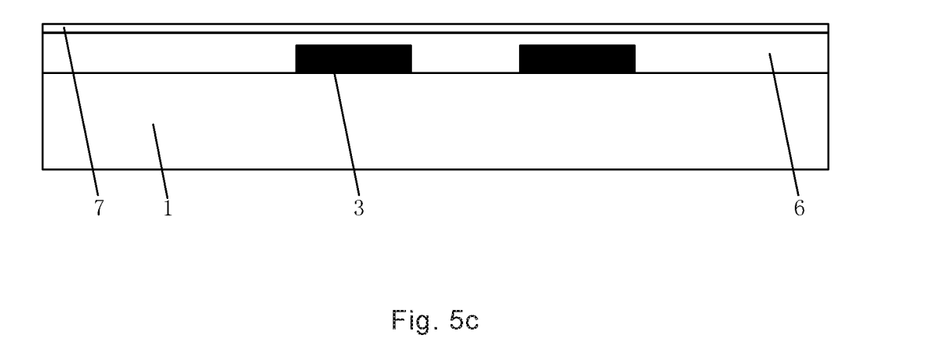
FIG. 5c is a schematic diagram illustrating forming a first polarizer in the third embodiment.

FIG. 5c is a schematic diagram illustrating forming a first polarizer in the third embodiment, and as shown in FIG. 5c, a first polarizer 7 is formed on the protective layer 6.

Step 204, forming quantum dot patterns on the first polarizer.

Figure 5D:
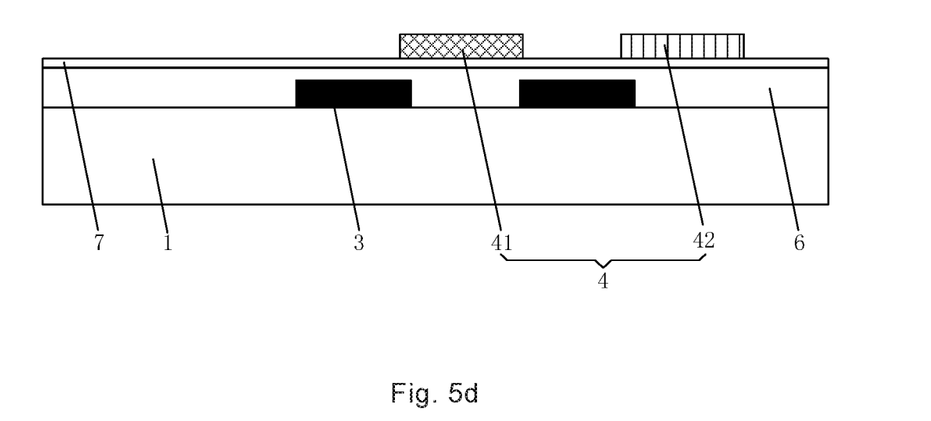
FIG. 5d is a schematic diagram illustrating forming quantum dot patterns in the third embodiment.

FIG. 5d is a schematic diagram illustrating forming quantum dot patterns in the third embodiment, and as shown in FIG. 5d, quantum dot patterns 4 are formed on the first polarizer 7 by a patterning process. Optionally, the quantum dot pattern 4 may be a red quantum dot pattern 42 or a green quantum dot pattern 41.

Step 205, forming a plurality of optical waveguide structures on the quantum dot patterns.

Figure 5E:
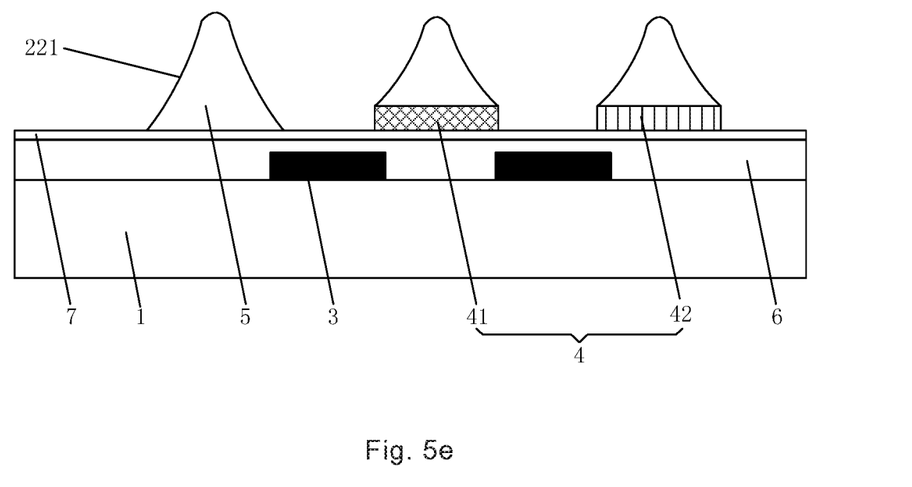
FIG. 5e is a schematic diagram illustrating forming an optical waveguide structure in the third embodiment.

FIG. 5e is a schematic diagram illustrating forming optical waveguide structures in the third embodiment, and as shown in FIG. 5e, optical waveguide structures 221 are formed on the quantum dot patterns 4 by a patterning process. The black matrix patterns 3 surround the quantum dot patterns 4 to define quantum dot pixel regions. Further, the black matrix patterns 3 may also define a non quantum dot pixel region 5, and an optical waveguide structure 221 may also be formed at the non quantum dot pixel region 5. In this case, the optical waveguide structure 221 is arranged on the first polarizer 7.

Step 206, forming a second base layer on the optical waveguide structures.

Figure 5F:
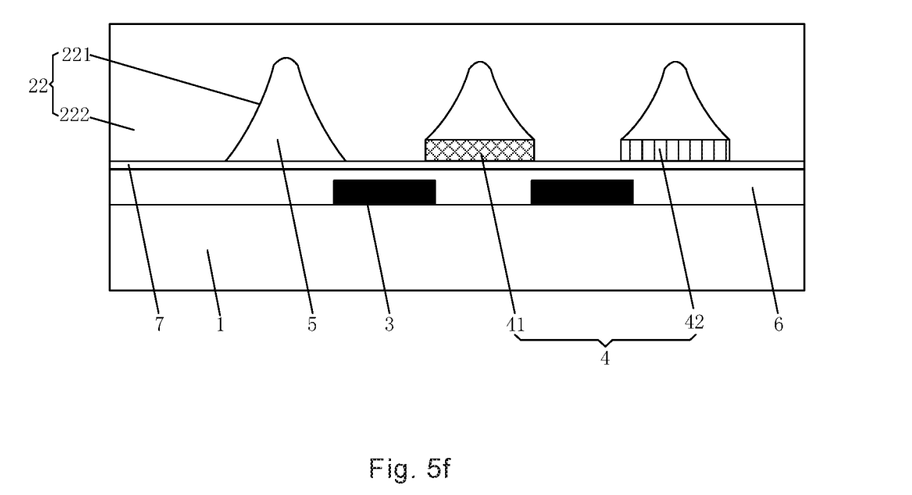
FIG. 5f is a schematic diagram illustrating forming a second base layer in the third embodiment.

FIG. 5f is a schematic diagram illustrating forming a second base layer in the third embodiment, and as shown in FIG. 5f, a second base layer 222 is deposited on the optical waveguide structures 221. The optical waveguide structures 221 and the second base layer 222 constitute a second optical layer 22.

Step 207, forming a first base layer on the second base layer.

Figure 5G:
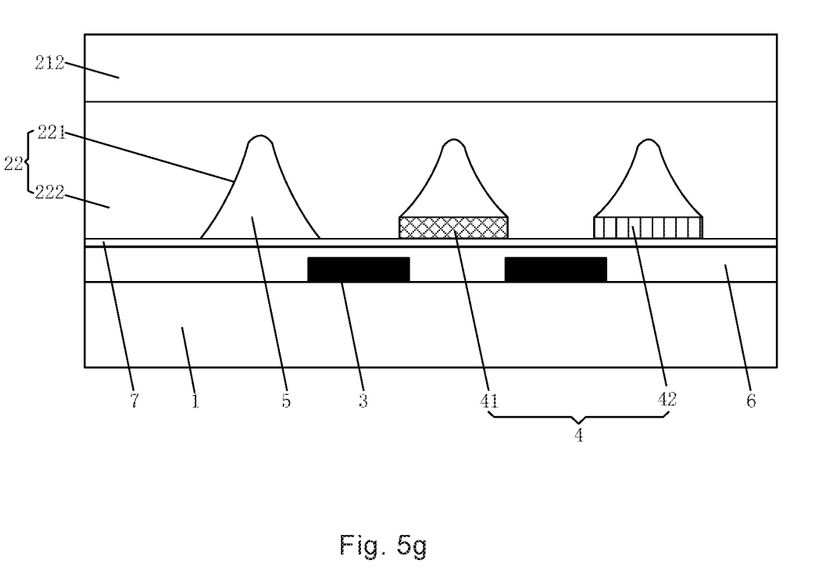
FIG. 5g is a schematic diagram illustrating forming a first base layer in the third embodiment.

FIG. 5g is a schematic diagram illustrating forming a first base layer in the third embodiment, and as shown in FIG. 5g, a first base layer 212 is deposited on the second base layer 222.

Step 208, forming a plurality of convex lens structures in the first substrate layer.

As shown in FIG. 1, a patterning process is performed on the first base layer 212 to forming blank structures which are the convex lens structures 211. In a practical application, optionally, the blank structures may also be filled with convex lens patterns to form the convex lens structures 211. The first base layer 212 and the convex lens structures 211 constitute the first optical layer 21.

In the embodiment, each step may be changed according to the change of the structures in the quantum dot display substrate, which is not repeatedly described in detail herein.

The manufacturing method of the quantum dot display substrate provided by this embodiment can be used to manufacture the quantum dot display substrate provided by the above first embodiment.

In the solution of the manufacturing method of the quantum dot display substrate of the embodiment, the first optical layer is configured to collimate incident light to generate collimated light and transmit the collimated light to the second optical layer; the second optical layer is configured to adjust an outgoing direction of the collimated light to generate outgoing light, and make the outgoing light irradiate onto the black matrix patterns, which prevents the outgoing light from irradiating onto the quantum dot pattern and makes the quantum dot display panel display in a real dark state. The quantum dot display substrate of the embodiment achieves true color, wide gamut, and high transmittance.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A quantum dot display substrate, comprising:
   black matrix patterns;
   quantum dot patterns surrounded by the black matrix patterns;
   a first base substrate; and
   a first optical layer and a second optical layer both arranged on a side of the first base substrate, wherein the first optical layer is arranged on a side of the second optical layer away from the first base substrate;
   the first optical layer is configured to collimate incident light to generate collimated light and transmit the collimated light to the second optical layer; and
   the second optical layer is configured to adjust an outgoing direction of the collimated light to generate outgoing light, and make the outgoing light irradiate onto the black matrix patterns and prevent the outgoing light from irradiating onto the quantum dot patterns.

2. The quantum dot display substrate of claim 1, wherein the quantum dot patterns and the black matrix patterns are arranged at a side of the second optical layer away from the first optical layer.

3. The quantum dot display substrate of claim 2, wherein the black matrix patterns are arranged on a side of the quantum dot patterns away from the second optical layer.

4. The quantum dot display substrate of claim 3, further comprising a protective layer arranged on the black matrix patterns and a first polarizer arranged on the protective layer; wherein the quantum dot patterns are arranged on the first polarizer.

5. The quantum dot display substrate of claim 1, wherein the first optical layer comprises a plurality of convex lens structures.

6. The quantum dot display substrate of claim 5, wherein convex surfaces of the plurality of convex lens structures are configured to face towards the second optical layer.

7. The quantum dot display substrate of claim 5, wherein the first optical layer further comprises a first base layer, and the plurality of convex lens structures are arranged in the first base layer.

8. The quantum dot display substrate of claim 5, wherein the plurality of convex lens structures are uniformly distributed.

9. The quantum dot display substrate of claim 1, wherein the second optical layer comprises a plurality of optical waveguide structures, configured to make the collimated light undergo total reflection to generate the outgoing light and make the outgoing light irradiate onto the black matrix patterns.

10. The quantum dot display substrate of claim 9, wherein the second optical layer comprises a second base layer, configured to cover the plurality of optical waveguide structures.

11. The quantum dot display substrate of claim 9, wherein the plurality of optical waveguide structures are arc-shaped.

12. The quantum dot display substrate of claim 11, wherein a cambered surface of a longitudinal section of the optical waveguide structure is recessed inside of the optical waveguide structure.

13. The quantum dot display substrate of claim 12, wherein each point on the cambered surface of the optical waveguide structure has a predetermined radian such that the collimated light undergoes a total reflection at the point to generate the outgoing light which will irradiate onto the black matrix pattern.

14. The quantum dot display substrate of claim 9, wherein the quantum dot patterns are arranged on a side of the optical waveguide structures away from the first optical layer, and the optical waveguide structures and the quantum dot patterns are arranged in one-to-one correspondence manner.

15. The quantum dot display substrate of claim 14, wherein the quantum dot patterns and the first optical layer are arranged at a same side of the first base substrate, and the optical waveguide structures are arranged on the quantum dot patterns, respectively.

16. The quantum dot display substrate of claim 1, wherein the quantum dot pattern is selected from a red quantum dot pattern, a green quantum dot pattern, or a combination thereof.

17. A quantum dot display device, comprising: an array substrate and the quantum dot display substrate of claim 1, which are arranged opposite to each other.

18. A manufacturing method of the quantum dot display substrate according to claim 1, the manufacturing method comprises:
  forming black matrix patterns and quantum dot patterns on the first base substrate such that the quantum dot patterns are arranged between the black matrix patterns, respectively;
  forming the second optical layer on a side of the first base substrate; and
  forming a first optical layer on a side of the second optical layer away from the first base substrate such that the first optical layer is configured to collimate incident light to generate collimated light and transmit the collimated light to the second optical layer; and the second optical layer is configured to adjust an outgoing direction of the collimated light to generate outgoing light, and make the outgoing light irradiate onto the black matrix patterns and prevent the outgoing light from irradiating onto the quantum dot patterns.

19. The manufacturing method of the quantum dot display substrate of claim 18, wherein the second optical layer comprises a second base layer and a plurality of optical waveguide structures;
  the step of forming the second optical layer on a side of the first base substrate further comprises:
  forming the plurality of optical waveguide structures on a side of the first base substrate; and
  forming the second base layer on the plurality of optical waveguide structures to cover the plurality of optical waveguide structures.

20. The manufacturing method of the quantum dot display substrate of claim 18, wherein the first optical layer comprises a first base layer and a plurality of convex lens structures;
  the step of forming a first optical layer on a side of the second optical layer away from the first base substrate comprises:
  forming the first base layer on a side of the second optical layer away from the first base substrate; and
  forming the plurality of convex lens structures in the first base layer.

* * * * *